United States Patent
Yoshino et al.

(10) Patent No.: US 6,806,509 B2
(45) Date of Patent: Oct. 19, 2004

(54) LIGHT-EMITTING SEMICONDUCTOR POTTING COMPOSITION AND LIGHT-EMITTING SEMICONDUCTOR DEVICE

(75) Inventors: Masachika Yoshino, Tokyo (JP); Toshio Shiobara, Usui-gun (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 0 days.

(21) Appl. No.: 10/797,139

(22) Filed: Mar. 11, 2004

(65) Prior Publication Data

US 2004/0178509 A1 Sep. 16, 2004

(30) Foreign Application Priority Data

Mar. 12, 2003 (JP) ........................................ 2003-066304

(51) Int. Cl.[7] .............................................. H01L 33/00
(52) U.S. Cl. ........................................ 257/103; 257/99
(58) Field of Search .................................. 257/99, 103

(56) References Cited

U.S. PATENT DOCUMENTS

| | | | | |
|---|---|---|---|---|
| 4,741,861 A | * | 5/1988 | Okada et al. | 516/120 |
| 5,314,979 A | * | 5/1994 | Okinoshima et al. | 528/15 |
| 6,010,646 A | * | 1/2000 | Schleifstein | 252/500 |
| 6,403,226 B1 | * | 6/2002 | Biernath et al. | 428/447 |
| 6,614,172 B2 | | 9/2003 | Chiu et al. | |
| 2002/0145152 A1 | | 10/2002 | Shimomura | |
| 2002/0190262 A1 | | 12/2002 | Nitta et al. | |

FOREIGN PATENT DOCUMENTS

| | | |
|---|---|---|
| JP | 7-25987 | 1/1995 |
| JP | 11-274571 | 10/1999 |
| JP | 2001-217467 | 8/2001 |
| JP | 2002-314139 | 10/2002 |
| JP | 2002-314143 | 10/2002 |
| JP | 2002-327126 | 11/2002 |
| JP | 2002-338833 | 11/2002 |

* cited by examiner

Primary Examiner—Ngân V. Ngô
(74) Attorney, Agent, or Firm—Oblon, Spivak, McClelland, Maier & Neustadt, P.C.

(57) ABSTRACT

A potting composition comprising (A) an organopolysiloxane having a vinyl group at an end of its molecular chain, (B) an organohydrogenpolysiloxane, (C) a platinum group metal catalyst, and optionally, (D) an organosilicon compound having a silicon atom-bonded alkoxy group. The cured product of the composition has a refractive index of 1.41–1.56 at 25° C. and 589 nm (sodium D line). The composition is suited for the embedment and protection of light-emitting semiconductor members. A package in which a light-emitting semiconductor member is embedded and protected with the potting composition undergoes little discoloration and maintains a high emission efficiency in heating tests, thus offering a light-emitting semiconductor device featuring a long life and energy saving.

5 Claims, 2 Drawing Sheets

LIGHT-EMITTING SEMICONDUCTOR POTTING COMPOSITION AND LIGHT-EMITTING SEMICONDUCTOR DEVICE

BACKGROUND OF THE INVENTION

1. Field of the Invention

This invention relates to a potting composition used for the embedment and protection of light-emitting semiconductor members and a light-emitting semiconductor device comprising a light-emitting semiconductor member embedded in the potting composition.

2. Background Art

Figure 2:
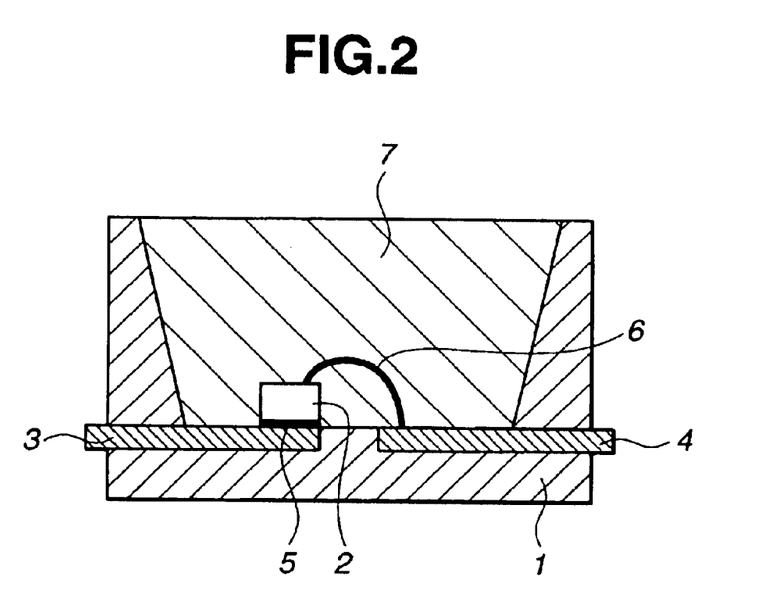
FIG. 2 is a schematic cross section of another exemplary surface mounting light-emitting semiconductor device in which a light-emitting member is die-bonded to lead electrodes inserted through a housing.
Figure 3:
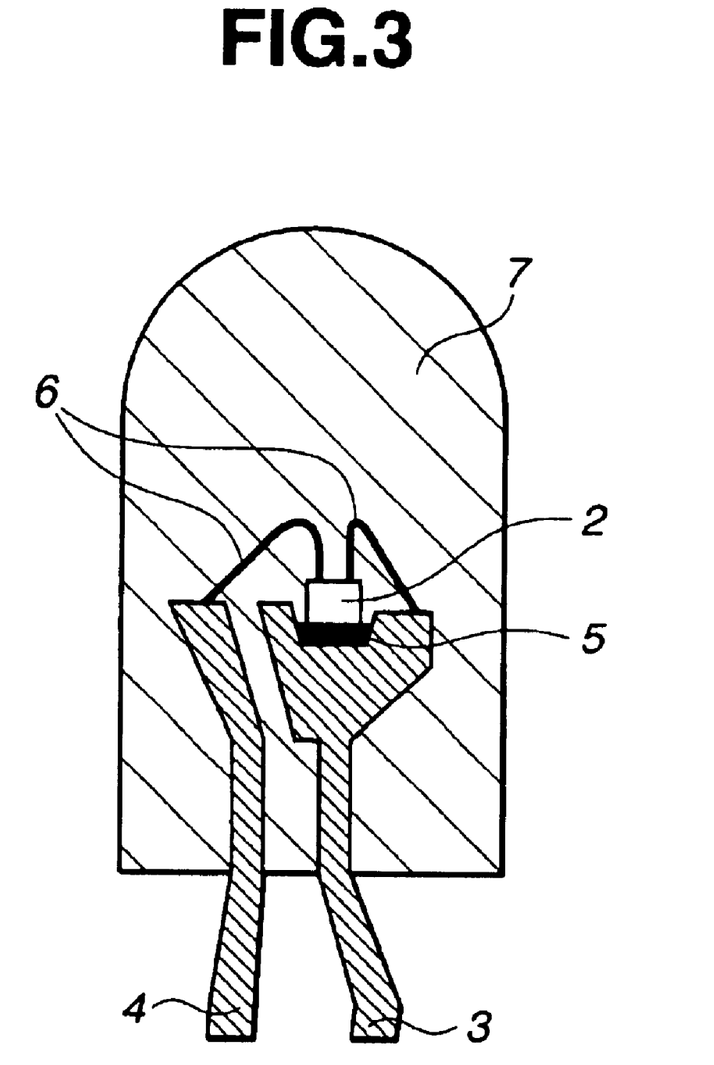
FIG. 3 is a schematic cross section of an LED as a lamp type light-emitting semiconductor device.

Traditional light-emitting semiconductor devices such as light-emitting diodes (LED) are lamp-type light-emitting semiconductor devices in which a light-emitting semiconductor member is disposed on a lead electrode and encapsulated with a transparent resin to a cannonball shape as shown in FIG. 3. They are recently replaced by the "surface mount" type as a result of simplification of the mounting technology. Nowadays surface mounting light-emitting semiconductor devices as shown in FIGS. 1 and 2 become the mainstream.

Figure 1:
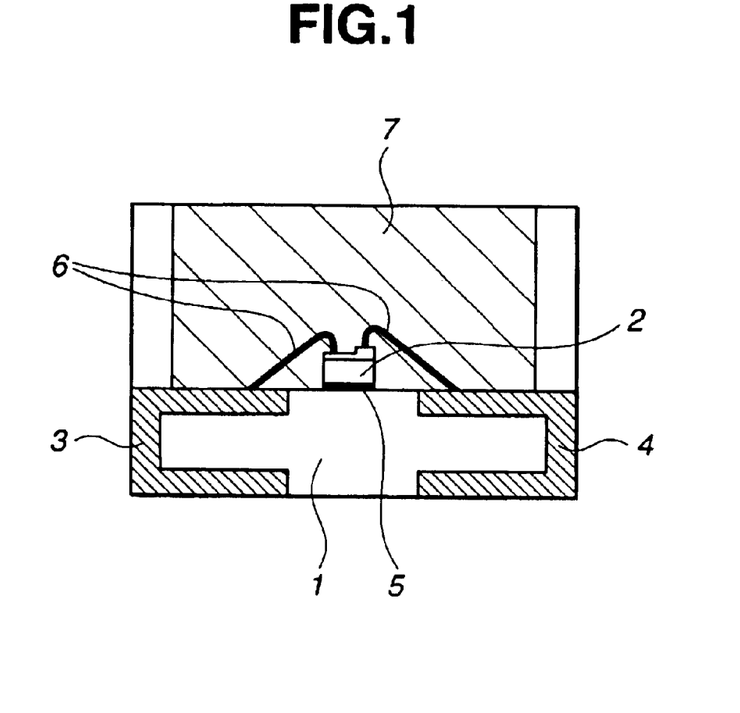
FIG. 1 is a schematic cross section of an exemplary surface mounting light-emitting semiconductor device in which a light-emitting member is die-bonded to an insulating housing.

In FIGS. 1 to 3, the device includes a housing 1 of glass fiber-reinforced epoxy resin, a light-emitting semiconductor member 2, lead electrodes 3 and 4, a die-bonding material 5, gold wires 6, and an encapsulant or potting composition 7.

While resin compositions are used for the embedment of light-emitting semiconductor members such as LED, it is required that the cured resin compositions be transparent. Then compositions comprising an epoxy resin such as a bisphenol A epoxy resin or alicyclic epoxy resin and an acid anhydride curing agent are generally used (see Japanese Patent No. 3,241,338 corresponding to JP-A 11-274571 and JP-A 7-025987).

However, these transparent epoxy resins have drawbacks including poor durability to moisture due to a high percent water absorption, poor durability to light due to a low transmittance of short wavelength light, and coloring due to photo-degradation.

Under the circumstances, resin compositions comprising an organic compound having at least two carbon-to-carbon double bonds (which are reactive with SiH groups) in a molecule, a silicon compound having at least two SiH groups in a molecule, and a hydrosilylating catalyst were proposed for the embedment and protection of optical semiconductor members (see JP-A 2002-327126 and JP-A 2002-338833).

Regrettably, such organic compounds undergo slow curing reaction, require a long time for curing, and produce substantial residual stresses. This necessitates the combined use of a thermoplastic resin having poor heat resistance or a hydrolyzable group-containing metal compound having poor storage stability. It was then proposed to use high-hardness silicone resins for the embedment and protection purposes (see JP-A 2002-314139 corresponding to US 2002-0145152 and JP-A 2002-314143 corresponding to US 2002-0190262).

The high-hardness silicone resins, however, are less adhesive. In an encased light-emitting semiconductor device comprising a light-emitting member disposed in a ceramic and/or plastic housing, wherein the housing interior is filled with a silicone resin, a problem arises in a thermal shock test between −40° C. and 120° C., that the silicone resin separates from the ceramic or plastic housing.

Another problem arises from the fact that optical crystals of various compound semiconductors used in light-emitting members, such as SiC, GaAs, GaP, GaAsP, GaAlAs, InAlGaP, InGaN, and GaN, have high refractive indices. If the refractive index of potting resin is low as in the case of dimethylsilicone resin, light is reflected at the interface between the potting resin and the optical crystal, resulting in a lower emission efficiency.

It is then proposed to add an antireflection film as a means of enhancing the outcoupling efficiency (see JP-A 2001-246236 and JP-A 2001-217467 corresponding to U.S. Pat. No. 6,614,172). The provision of an antireflection film undesirably adds preparation steps and increases the cost.

SUMMARY OF THE INVENTION

An object of the invention is to provide a light-emitting semiconductor potting composition having minimized internal stress, improved adhesion and high light transmittance, and a light-emitting semiconductor device having a high emission efficiency.

We have found that an addition reaction-curing silicone resin composition comprising a phenyl group-containing organopolysiloxane having a vinyl group at an end of its molecular chain as a base polymer and optionally, an organosilicon compound having a silicon atom-bonded alkoxy group possesses both low stress and transparency in the cured state and exhibits satisfactory adhesive properties. The present invention is predicated on this finding.

In one aspect, the present invention provides a light-emitting semiconductor potting composition comprising (A) 100 parts by weight of an organopolysiloxane having a vinyl group at an end of its molecular chain, represented by the average compositional formula (1):

wherein R is a monovalent organic group, at least 5 mol % of R being phenyl, and "a" is a number of 1.5 to 3.0, (B) an organohydrogenpolysiloxane having at least two hydrogen atoms each directly bonded to a silicon atom in a molecule, represented by the average compositional formula (2):

wherein $R^1$ is a monovalent organic group, b is a positive number of 0.7 to 2.1, c is a positive number of 0.001 to 1.0, and the sum of b+c is 0.8 to 3, in an amount to give 0.7 to 10 silicon atom-bonded hydrogen atoms per vinyl group in component (A), (C) a platinum group metal catalyst in an amount to give 1 to 1,000 ppm of platinum group metal based on the weight of components (A) and (B) combined, and (D) 0 to 10 parts by weight of an organosilicon compound having an alkoxy group bonded to a silicon atom. The cured product of the composition should have a refractive index of 1.41 to 1.56 at 25° C. and 589 nm (sodium D line).

In another aspect, the present invention provides a light-emitting semiconductor device comprising a ceramic and/or plastic housing defining an open interior and a light-emitting semiconductor member disposed in the housing; or a light-emitting semiconductor device comprising a ceramic and/or plastic housing defining an open interior and a light-emitting semiconductor member disposed on lead electrodes in the housing. In both the embodiments, the interior of the housing is filled with the potting composition in the cured state so that the semiconductor member is embedded in and protected with the cured composition.

DESCRIPTION OF THE PREFERRED EMBODIMENT

In the potting composition (silicone rubber composition) intended for the embedment and protection of light-emitting semiconductor members, component (A) is a main component or base polymer of the potting composition. It cures through crosslinking with component (B) under the catalysis of component (C). It is an organopolysiloxane having a vinyl group at an end, especially each end of its molecular chain, represented by the average compositional formula (1):

$$R_a SiO_{(4-a)/2} \tag{1}$$

wherein R is a monovalent organic group, at least 5 mol % of R being phenyl, and "a" is a number of 1.5 to 3.0.

Suitable organic groups represented by R include substituted or unsubstituted monovalent hydrocarbon groups having 1 to 10 carbon atoms, especially 1 to 8 carbon atoms, for example, alkyl groups such as methyl, ethyl, propyl, isopropyl, butyl, isobutyl, tert-butyl, pentyl, neopentyl, hexyl, cyclohexyl, octyl, nonyl and decyl; aryl groups such as phenyl, tolyl, xylyl and naphthyl; aralkyl groups such as benzyl, phenylethyl and phenylpropyl; alkenyl groups such as vinyl, allyl, propenyl, isopropenyl, butenyl, hexenyl, cyclohexenyl and octenyl; and substituted ones of the foregoing in which some or all of the hydrogen atoms are substituted with halogen atoms (e.g., fluoro, bromo or chloro), cyano groups or the like, such as haloalkyl groups, e.g., chloromethyl, chloropropyl, bromoethyl and trifluoropropyl, and cyanoethyl.

At least two of R groups are vinyl groups. That is, the organopolysiloxane should have a vinyl group bonded to a silicon atom at an end of its molecular chain, especially at each end thereof. In addition, the organopolysiloxane may have an alkenyl group such as vinyl on a side chain (i.e., as a monovalent organic group R bonded to a silicon atom midway in the molecular chain). The content of alkenyl groups inclusive of vinyl is preferably 0.01 to 20 mol %, especially 0.1 to 10 mol % of the entire organic groups R when the elasticity, elongation, physical strength and other properties of the potting composition in the cured state are taken into account.

Also, at least 5 mol % of R groups are phenyl groups. If phenyl groups are less than 5 mol % of R, the potting composition in the cured state has poor heat resistance or poor low-temperature characteristics, incurring a decline of reliability in a thermal shock test. Thus, at least 5 mol % of R groups should be phenyl groups. Preferably at least 7 mol %, more preferably at least 10 mol % of R should be phenyl groups. The upper limit is not critical although the phenyl group content is preferably up to 80 mol %, especially up to 60 mol %.

In the organopolysiloxane (A), a vinyl group is essentially located at an end, that is, a silicon atom on at least one end of the molecular chain has a vinyl group attached thereto. In addition to the vinyl groups, there are included phenyl groups, especially both methyl and phenyl groups. Namely, while the silicone rubber composition of the invention crosslinks by way of terminal vinyl groups on the organopolysiloxane, methyl is most preferred among the aforementioned groups as the monovalent organic groups other than the phenyl and vinyl groups, from the standpoints of heat resistance and cost.

The subscript "a" is a positive number of 1.5 to 3.0. The organopolysiloxane may be either of straight chain, branched chain or three-dimensional network. Most often, it is a basically straight chain diorganopolysiloxane whose backbone consists of repeating diorganosiloxane units ($R_2SiO_{2/2}$) and which is blocked with triorganosiloxy groups ($R_3SiO_{1/2}$) at both ends of its molecular chain. The subscript "a" is preferably a number of 1.8 to 2.2, more preferably 1.95 to 2.05.

For ease of operation, the organopolysiloxane preferably has a viscosity of about 0.1 to 20 Pa.s, especially about 0.5 to 10 Pa.s at 23° C. A viscosity of less than 0.1 Pa.s indicates an excess fluidity, sometimes forming more burrs when molded. A viscosity of more than 20 Pa.s may impede escape of air bubbles entrained upon mixing of necessary components.

Illustrative examples of the organopolysiloxane (A) are given below.

Note that the array of recurring units such as in the above formulae is random and that the total number of recurring units is an arbitrary natural number so that the compound may have a viscosity within the above-defined range.

Component (B) is essential for forming a cured product of component (A) by inducing addition reaction with component (A) for crosslinking under the catalysis of component (C). It is an organohydrogenpolysiloxane having at least two hydrogen atoms, preferably at least three hydrogen atoms, each directly bonded to a silicon atom in a molecule, represented by the average compositional formula (2):

$$R^1_b H_c SiO_{(4-b-c)/2} \qquad (2)$$

wherein $R^1$ is a monovalent organic group, b and c are positive numbers in the range: $0.7 \leq b \leq 2.1$, $0.001 \leq c \leq 1.0$, and $0.8 \leq b+c \leq 3$.

Suitable organic groups represented by $R^1$ include substituted or unsubstituted monovalent hydrocarbon groups having 1 to 10 carbon atoms, especially 1 to 8 carbon atoms, as exemplified above for R in formula (1). Those groups free of aliphatic unsaturation are preferred, with methyl and phenyl being more preferred.

The subscripts b and c are positive numbers as defined above, and preferably in the range: $0.9 \leq b \leq 2$, $0.01 \leq c \leq 2$, and $1 \leq b+c \leq 2.6$.

Examples of the organohydrogenpolysiloxane include 1,1,3,3-tetramethyldisiloxane, 1,3,5,7-tetramethylcyclotetrasiloxane, both end trimethylsiloxy-capped methylhydrogenpolysiloxane, both end trimethylsiloxy-capped dimethylsiloxane-methylhydrogensiloxane copolymers, both end dimethylhydrogensiloxy-capped dimethylpolysiloxane, both end dimethylhydrogensiloxy-capped dimethylsiloxane-methylhydrogensiloxane copolymers, both end trimethylsiloxy-capped methylhydrogensiloxane-diphenylsiloxane copolymers, both end trimethylsiloxy-capped methylhydrogensiloxane-diphenylsiloxane-dimethylsiloxane copolymers, copolymers consisting of $(CH_3)_2HSiO_{1/2}$ units and $SiO_{4/2}$ units, and copolymers consisting of $(CH_3)_2HSiO_{1/2}$ units, $SiO_{4/2}$ units and $(C_6H_5)SiO_{3/2}$ units.

The molecular structure of the organohydrogenpolysiloxane may be either straight, branched, cyclic or three-dimensional network. The number of silicon atoms per molecule, i.e., degree of polymerization is preferably in the range of about 3 to about 1,000, more preferably about 3 to about 300. Preferably the organohydrogenpolysiloxane has a viscosity of 0.1 to 5,000 mPa.s at 23° C. A viscosity of less than 0.1 mPa.s may allow quick volatilization upon heat curing whereas a viscosity in excess of 5,000 mPa.s may impede potting operation. It suffices that the organohydrogenpolysiloxane has at least two, preferably at least three silicon atom-bonded hydrogen atoms (SiH groups) in a molecule. With too many SiH groups, however, cured products become too brittle. Then the number of SiH groups is preferably limited to 50 or less, especially 30 or less.

An appropriate amount of the organohydrogenpolysiloxane (B) blended is such as to give 0.7 to 10 silicon atom-bonded hydrogen atoms (SiH groups) per vinyl group in component (A). Less than 0.7 lead to slow curing whereas more than 10 SiH groups form a cured product which is too brittle. The preferred number of SiH groups is 0.8 to 5.

Component (C) is a platinum group metal catalyst for promoting the addition reaction between vinyl groups in component (A) and SiH groups in component (B). Owing to the action of component (C), the inventive composition can be cured. Typical catalysts include platinum catalysts such as microparticulate platinum, microparticulate platinum adsorbed to carbon powder support, chloroplatinic acid, alcohol-modified chloroplatinic acid, olefin complexes of chloroplatinic acid, vinylsiloxane coordinate compounds of chloroplatinic acid, and platinum black, as well as palladium catalysts and rhodium catalysts. The catalyst may be used in a catalytic amount, specifically in an amount to give about 1 to 1,000 ppm of platinum group metal based on the weight of components (A) and (B) combined. The curing rate is low at less than 1 ppm whereas more than 1,000 ppm leads to a short pot-life after mixing of all the components and is uneconomical. The preferred catalytic amount is 5 to 500 ppm.

Component (D) serves to improve the adhesion of the inventive silicone rubber composition in the cured state. It is an organosilicon compound having an alkoxy group bonded to a silicon atom, typically selected from organosilanes, partial hydrolytic condensate thereof and organopolysiloxanes having a silicon atom-bonded alkoxy group. The organosilane is preferably an alkoxysilane having the following general formula (3):

$$R^2_p Si(OR^3)_{4-p} \qquad (3)$$

In the formula, p is 0, 1 or 2, preferably 0 or 1, $R^2$ is an unsubstituted monovalent hydrocarbon group having 1 to 10 carbon atoms including an alkyl group (such as methyl, ethyl, propyl, isopropyl, butyl, isobutyl, tert-butyl, hexyl, and cyclohexyl groups), an alkenyl group (such as vinyl, allyl, propenyl, hexenyl, and cyclohexenyl groups), and an aryl group (such as phenyl, tolyl, and xylyl groups), or a substituted monovalent hydrocarbon group having 1 to 10 carbon atoms including epoxy group-substituted alkyl groups, (meth)acryloxy group-substituted alkyl groups, amino group-substituted alkyl groups, and (N-substituted amino group)-substituted alkyl groups which have epoxy group, (meth)acryloxy group, amino group or N-substituted amino group at the end, such as 3-glycidoxy propyl group, 3-methacryloxypropyl group, 3-aminopropyl group, N-2-(aminoethyl)-3-aminopropyl group, and N-phenyl-3-aminopropyl group. $R^3$ is an alkyl group having 1 to 4 carbon atoms such as methyl, ethyl, propyl, isopropyl, butyl, isobutyl, and tert-butyl groups.

The partial hydrolytic condensate of the alkoxysilane of formula (3) (i.e., the organosiloxane oligomer having at least one, preferably at least two residual alkoxy groups in the molecule which is obtained from the alkoxysilane of formula (3)) is also used.

Examples of the alkoxysilane of formula (3) include tetramethoxysilane, tetraethoxysilane, dimethyldimethoxysilane, methylphenyldimethoxysilane, methylphenyldiethoxysilane, phenyltrimethoxysilane, methyltrimethoxysilane, methyltriethoxysilane, vinyltrimethoxysilane, allyltrimethoxysilane, allyltriethoxysilane, 3-glycidoxypropyltrimethoxysilane, and 3-methacryloxypropyltrimethoxysilane. The partial hydrolytic condensates thereof are also used. Moreover, alkoxy group-containing siloxane compounds of straight chain or cyclic structure (i.e., organosiloxane oligomers) having about 4 to about 30 silicon atoms, especially about 4 to about 20 silicon atoms as represented by the formulae below are used.

-continued

Note that m and n are integers of at least 1.

Of the organosilicon compounds as component (D), those organosilicon compounds having silicon atom-bonded alkoxy groups and silicon atom-bonded alkenyl groups or silicon atom-bonded hydrogen atoms (i.e., SiH groups) in a molecule are preferred because the cured compositions are more adhesive.

Component (D) is included in an amount of 0 to 10 parts by weight, preferably 0.5 to 10 parts by weight, more preferably 0.5 to 3 parts by weight, per 100 parts by weight of component (A). More than 10 pbw of component (D) per 100 pbw of component (A) results in a cured product which is too hard and undesirably becomes less adhesive.

When component (D) has silicon atom-bonded alkenyl groups or silicon atom-bonded hydrogen atoms (i.e., SiH groups), the molar ratio Y/X of the total amount Y of SiH groups to the total amount X of alkenyl groups in the composition including components (A), (B) and (D) is preferably from about 0.7 to about 10 mol/mol, more preferably from about 0.8 to about 5 mol/mol.

The potting composition (silicone rubber composition) of the invention cures into a silicone resin. Using Model 2010 Prism Coupler (Metricon Corp.) or a goniometer (Moller-Wedel), the refractive index of the silicone resin can be measured at the emission wavelength of a light-emitting member. However, since the refractive index of a silicone resin at a certain wavelength is in accord with the Sellmeier equation, the refractive index at any wavelength can be computed from the refractive index measured at 589 nm. See Cooper P. R., 1982, Refractive index measurements of paraffin, a silicone elastomer, and an epoxy resin over the 500–1,500 nm spectral range, Appl. Opt., 21, 3413–15.

Thus, the refractive index of a silicone resin obtained by curing of the inventive composition can be managed in terms of the refractive index at 589 nm (D line of sodium). The silicone resin obtained by curing of the inventive composition should preferably have a refractive index at 25° C. and 589 nm of 1.41 to 1.56. If this refractive index is less than 1.41, emission efficiency becomes low due to interfacial reflection. If the refractive index is more than 1.56, the silicone resin becomes more crystalline and has a more birefringence, leading to a lower emission output. The preferred refractive index at 25° C. and 589 nm is in the range of 1.43 to 1.55. The refractive index of the cured product (the cured resin) can be adjusted by selecting compositional structures of components (A) and (B), especially phenyl group contents of components (A) and (B).

By virtue of a high bonding force, the inventive silicone resin composition never undergoes separation upon resin curing or IR reflow during mounting operation. Since the cured resin is low elastic as demonstrated by a Durometer Type A hardness of up to 75, it can absorb the stresses induced by a difference in coefficient of thermal expansion from the ceramic or plastic housing. Then the cured resin develops no cracks even after 1,000 cycles of a thermal shock test between a low temperature of −40° C. and a high temperature of 120° C. The Durometer Type A hardness of the cured product (the cured resin) is generally up to 75, preferably 5 to 75, more preferably 10 to 20, and most preferably 20 to 65 . The Durometer Type A hardness of the cured product can be adjusted by selecting a crosslink density of the composition which is evaluated as a molar ratio (Y/X) of the content of SiH groups (Y) to the content of alkenyl groups (X) bonded to silicon atoms, an amount of organopolysiloxanes such as methylpolysiloxanes, vinylmethylpolysiloxanes and methylhydrogenpolysiloxanes having three-dimensional network structure (or resin structure) containing $SiO_2$, units, and an amount of reinforcing fillers.

The silicone rubber composition of the invention is readily prepared by mixing the four components (A) to (D) and heating the mixture. Cure takes place even at room temperature once the four components are combined together. It is then preferred to add minor amounts of reaction inhibitors such as acetylene alcohol compounds, triazoles, nitrile compounds or phosphorus compounds to the composition for extending the pot-life. It is also acceptable to add phosphors and light scattering agents such as titanium oxide fine powder ($TiO_2$) for wavelength tailoring to the inventive silicone rubber composition.

Additionally, reinforcing fillers such as fumed silica and precipitated silica, flame retardants, organic solvents and the like may be added insofar as the objects of the invention are not compromised.

Preferably the potting composition (silicone rubber composition) of the invention is liquid at room temperature. Specifically, it preferably has a viscosity at 23° C. of 10 to 1,000,000 mPa.s, especially 100 to 1,000,000 mPa.s.

The potting composition of the invention is used for the embedment and protection of light-emitting semiconductor members. The light-emitting semiconductor members to which the invention is applicable include light-emitting diodes (LED), organic electroluminescent devices (organic EL), laser diodes, and LED arrays. It is not critical how to embed light-emitting semiconductor members. In a typical procedure, as shown in FIGS. 1 and 2, a light-emitting semiconductor member 2 is disposed in an open interior of a housing 1, the interior is filled with the potting composition 7 so as to surround the light-emitting semiconductor member 2, and the composition is cured.

For the inventive potting composition, the curing conditions may be selected from a wide range from about 72 hours at room temperature (25° C.) to about 3 minutes at 200° C. and in accordance with working conditions. An appropriate set of conditions may be determined by taking a balance with productivity and the heat resistance of a light-emitting semiconductor member and a housing.

EXAMPLE

Examples of the invention are given below by way of illustration and not by way of limitation. All parts are by weight. The viscosity is the value at 23° C.

First described are tests for evaluating potting compositions of Examples and Comparative Examples.

Tests

Preparation of Silicone Base Die-bonding Material

A silicone base die-bonding material was prepared by intimately mixing 100 parts of a vinyl-terminated dimethyldiphenylpolysiloxane (viscosity 3 Pa.s) having formula (I), 2.5 parts of a methylhydrogenpolysiloxane (viscosity 15 mPa.s) having formula (II), 0.03 part of 2-ethylhexyl alcohol-modified chloroplatinic acid solution (Pt concentration 2 wt %), 0.05 part of ethynylcyclohexyl alcohol, 7 parts of 3-glycidoxypropyltrimethoxysilane, and 400 parts of spherical alumina fine powder having an average particle diameter of 9 μm.

Fabrication of Light-emitting Semiconductor Device

A light-emitting semiconductor device as shown in FIG. 1 was fabricated. An LED chip including an emissive layer of InGaN and having a main emission peak at 470 nm was used as a light-emitting member 2. The light-emitting member 2 was secured to a housing 1 of glass fiber-reinforced epoxy resin having a pair of lead electrodes 3 and 4, by using the silicone base die-bonding material 5 and heating at 180° C. for 10 minutes. Gold wires 6 were bonded to the light-emitting member 2 and the lead electrodes 3 and 4 for electrical connection. A potting composition 7 was cast into the interior of the housing 1 and cured at 180° C. for one hour, completing a light-emitting semiconductor device.

Measurement of the Luminance of Light-emitting Semiconductor Device

A constant current flow was conducted across the light-emitting semiconductor device fabricated by the above potting method, whereby it emitted light toward a photo detector. After 5 seconds from the current conduction, the current output of the photo detector was measured as a measure of luminance. The luminance was reported as a relative value based on a luminance of 1.00 for the light-emitting semiconductor device of Example 1.

Measurement of Current Conduction Luminance Drop of Light-emitting Semiconductor Device at high Temperature

Further, a current flow of 20 mA was conducted across the light-emitting semiconductor device in a 150° C. atmosphere for 1,000 hours. Thereafter, room temperature was resumed, and a constant current flow was conducted across the light-emitting semiconductor device. After 5 seconds from the current conduction, the current output of the photo detector was measured. It was compared with the current output before the high-temperature current conduction, determining a luminance drop by heat degradation. The result was reported as a relative value based on the initial luminance of 1.00 for the light-emitting semiconductor device of Example 1.

Thermal Shock Test

On light-emitting semiconductor device samples fabricated as above, a thermal shock test of cooling to −40° C. and heating to 120° C. was performed 1,000 cycles. The outer appearance of samples was inspected for cracks, the number of cracked samples being reported.

Example 1

A silicone potting material was prepared by intimately mixing 100 parts of a vinyl-terminated dimethyldiphenylpolysiloxane (viscosity 3 Pa.s) having formula (I), 2.5 parts of a methylhydrogenpolysiloxane (viscosity 15 mPa.s) having formula (II), 0.03 part of 2-ethylhexyl alcohol-modified chloroplatinic acid solution (Pt concentration 2 wt %), 0.05 part of ethynylcyclohexyl alcohol, and 2 parts of an alkoxy-containing silicone compound having formula (III).

(II)

(III)

The potting material cured into a silicone resin which had a Durometer type A hardness of 33 and a refractive index of 1.48 at 25° C. and 589 nm. Using the potting material, a light-emitting semiconductor device was fabricated as above.

Example 2

A silicone potting material was prepared by intimately mixing 100 parts of a vinyl-terminated dimethyldiphenylpolysiloxane (viscosity 5 Pa.s) having formula (IV), 7.0 parts of a methylhydrogenpolysiloxane (viscosity 90 mPa.s) having formula (V), 0.03 part of 2-ethylhexyl alcohol-modified chloroplatinic acid solution (Pt concentration 2 wt %), 0.05 part of ethynylcyclohexyl alcohol, and 3 parts of 3-methacryloxypropyltrimethoxysilane.

(IV)

(V)

The potting material cured into a silicone resin which had a Durometer type A hardness of 24 and a refractive index of 1.45 at 25° C. and 589 nm. Using the potting material, a light-emitting semiconductor device was fabricated as above.

Example 3

A silicone potting material was prepared by intimately mixing 100 parts of a vinyl-terminated dimethyldiphenylpolysiloxane (viscosity 2 Pa.s) having formula (VI), 4.1 parts of a phenylmethylhydrogenpolysiloxane (viscosity 30 mPa.s) having formula (VII), 0.03 part of 2-ethylhexyl alcohol-modified chloroplatinic acid solution (Pt concentration 2 wt %), 0.05 part of ethynylcyclohexyl alcohol, and 2 parts of an alkoxy-containing silicone compound having formula (VIII).

(VI)

(VII)

(VIII)

The potting material cured into a silicone resin which had a Durometer type A hardness of 62 and a refractive index of 1.53 at 25° C. and 589 nm. Using the potting material, a light-emitting semiconductor device was fabricated as above.

Comparative Example 1

In an organic solvent (xylene) were blended 100 parts of a bisphenol A epoxy resin (EP 827 by Yuka Shell Epoxy Co., Ltd.) and 20 parts of polydimethylsiloxane having two amino groups and a molecular weight of 1,680. The blend was heat treated at 150° C., after which the organic solvent was volatilized off, yielding a modified bisphenol A epoxy resin. 120 parts of the modified bisphenol A epoxy resin was blended with 100 parts of 4-methylhexahydrophthalic anhydride and 0.4 part of 2-ethyl-4-methylimidazole. They were intimately mixed to give an epoxy potting material.

The epoxy potting material cured into a resin which had a Durometer type A hardness of 92 and a refractive index of 1.56 at 25° C. and 589 nm. Using the potting material, a light-emitting semiconductor device was fabricated as above.

Comparative Example 2

A silicone potting material was prepared by intimately mixing 100 parts of a vinyl-terminated dimethylpolysiloxane (viscosity 3 Pa.s) having formula (IX), 2.0 parts of a methylhydrogenpolysiloxane (viscosity 15 mPa.s) having formula (II), 0.03 part of 2-ethylhexyl alcohol-modified chloroplatinic acid solution (Pt concentration 2 wt %), and 0.05 part of ethynylcyclohexyl alcohol.

(IX)

(II)

The potting material cured into a silicone resin which had a Durometer type A hardness of 58 and a refractive index of 1.40 at 25° C. and 589 nm. Using the potting material, a light-emitting semiconductor device was fabricated as above.

Comparative Example 3

A silicone potting material was prepared by intimately mixing 50 parts of a vinylmethylpolysiloxane of resin structure consisting of 50 mol % $SiO_2$ units, 42.5 mol % $(CH_3)_3SiO_{0.5}$ units and 7.5 mol % $Vi(CH_3)_2SiO_{0.5}$ units wherein Vi is vinyl, 50 parts of a vinyl-terminated dimethylpolysiloxane (viscosity 3 Pa.s) having formula (IX), 4.0 parts of a methylhydrogenpolysiloxane (viscosity 15 mPa.s) having formula (II), 0.03 part of 2-ethylhexyl alcohol-modified chloroplatinic acid solution (Pt concentration 2 wt %), and 0.05 part of ethynylcyclohexyl alcohol.

The potting material cured into a silicone resin which had a Durometer type A hardness of 80 and a refractive index of 1.41 at 25° C. and 589 nm. Using the potting material, a light-emitting semiconductor device was fabricated as above.

Table 1 shows the test results of the potting materials of Examples and Comparative Examples.

TABLE 1

|  | Example | | | Comparative Example | | |
|---|---|---|---|---|---|---|
|  | 1 | 2 | 3 | 1 | 2 | 3 |
| Resin hardness | 33 | 24 | 62 | 92 | 58 | 80 |
| Resin refractive index | 1.48 | 1.45 | 1.53 | 1.56 | 1.40 | 1.41 |
| Luminance* | 1.00 | 1.00 | 1.06 | 1.10 | 0.65 | 0.70 |
| Luminance drop by current conduction* | 0.99 | 0.98 | 1.02 | 0.12 | 0.65 | 0.68 |
| Thermal shock test (cracked samples) | 0/50 | 0/50 | 1/50 | 50/50 | separated 30/50 | separated 50/50 |

*relative value based on an initial luminance of 1.00 for the light-emitting semiconductor device of Example 1.

The light-emitting semiconductor device in which the light-emitting semiconductor member is embedded and protected with the potting composition of the invention undergoes little discoloration and maintains a high emission efficiency in the heating tests. The invention that offers a light-emitting semiconductor device featuring a long life and energy saving is of great industrial worth.

Japanese Patent Application No. 2003-066304 is incorporated herein by reference.

The invention has been described in detail with particular reference to preferred embodiments thereof, but it will be understood by those skilled in the art that variations and modifications can be effected within the spirit and scope of the invention.

What is claimed is:

1. A light-emitting semiconductor potting composition comprising
   (A) 100 parts by weight of an organopolysiloxane having a vinyl group at an end of its molecular chain, represented by the average compositional formula (1):

$$R_a SiO_{(4-a)/2} \tag{1}$$

wherein R is a monovalent organic group, at least 5 mol % of R being phenyl, and "a" is a number of 1.5 to 3.0,
   (B) an organohydrogenpolysiloxane having at least two hydrogen atoms each directly bonded to a silicon atom in a molecule, represented by the average compositional formula (2):

$$R^1{}_b H_c SiO_{(4-b-c)/2} \tag{2}$$

wherein $R^1$ is a monovalent organic group, b is a positive number of 0.7 to 2.1, c is a positive number of 0.001 to 1.0, and the sum of b+c is 0.8 to 3, in an amount to give 0.7 to 10 silicon atom-bonded hydrogen atoms per vinyl group in component (A),
   (C) a platinum group metal catalyst in an amount to give 1 to 1,000 ppm of platinum group metal based on the weight of components (A) and (B) combined, and
   (D) 0 to 10 parts by weight of an organosilicon compound having an alkoxy group bonded to a silicon atom,
   the cured product of said composition having a refractive index of 1.41 to 1.56 at 25° C. and 589 nm (sodium D line).

2. The composition of claim 1 which is cured into the cured product having a refractive index of 1.43 to 1.55 at 25° C. and 589 nm (sodium D line).

3. The composition of claim 1 which is cured into the cured product having a Durometer Type A hardness of up to 75.

4. A light-emitting semiconductor device comprising a ceramic and/or plastic housing defining an open interior and a light-emitting semiconductor member disposed in the housing, the interior of the housing being filled with the potting composition of claim 1 in the cured state.

5. A light-emitting semiconductor device comprising a ceramic and/or plastic housing defining an open interior and a light-emitting semiconductor member disposed on lead electrodes in the housing, the interior of the housing being filled with the potting composition of claim 1 in the cured state.

* * * * *

(12) EX PARTE REEXAMINATION CERTIFICATE (9380th)
United States Patent
Yoshino et al.

(10) Number: US 6,806,509 C1
(45) Certificate Issued: Oct. 26, 2012

(54) LIGHT-EMITTING SEMICONDUCTOR POTTING COMPOSITION AND LIGHT-EMITTING SEMICONDUCTOR DEVICE

(75) Inventors: Masachika Yoshino, Tokyo (JP); Toshio Shiobara, Usui-gun (JP)

(73) Assignee: Shin-Etsu Chemical Co., Ltd., Chiyoda-Ku, Tokyo (JP)

Reexamination Request:
No. 90/009,962, Oct. 20, 2011

Reexamination Certificate for:
Patent No.: 6,806,509
Issued: Oct. 19, 2004
Appl. No.: 10/797,139
Filed: Mar. 11, 2004

(30) Foreign Application Priority Data

Mar. 12, 2003 (JP) .................. 2003-066304

(51) Int. Cl.
*C08K 5/54* (2006.01)
*C08L 83/04* (2006.01)
*G02B 6/42* (2006.01)
*H01L 33/00* (2010.01)

(52) U.S. Cl. .................. 257/103; 257/99; 257/E33.059
(58) Field of Classification Search .................. None
See application file for complete search history.

(56) References Cited

To view the complete listing of prior art documents cited during the proceeding for Reexamination Control Number 90/009,962, please refer to the USPTO's public Patent Application Information Retrieval (PAIR) system under the Display References tab.

*Primary Examiner* — Erik Kielin (57) ABSTRACT

A potting composition comprising (A) an organopolysiloxane having a vinyl group at an end of its molecular chain, (B) an organohydrogenpolysiloxane, (C) a platinum group metal catalyst, and optionally, (D) an organosilicon compound having a silicon atom-bonded alkoxy group. The cured product of the composition has a refractive index of 1.41-1.56 at 25° C. and 589 nm (sodium D line). The composition is suited for the embedment and protection of light-emitting semiconductor members. A package in which a light-emitting semiconductor member is embedded and protected with the potting composition undergoes little discoloration and maintains a high emission efficiency in heating tests, thus offering a light-emitting semiconductor device featuring a long life and energy saving.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 8, line 41:

By virtue of a high bonding force, the inventive silicone resin composition never undergoes separation upon resin curing or IR reflow during mounting operation. Since the cured resin is low elastic as demonstrated by a Durometer Type A hardness of up to 75, it can absorb the stresses induced by a difference in coefficient of thermal expansion from the ceramic or plastic housing. Then the cured resin develops no cracks even after 1,000 cycles of a thermal shock test between a low temperature of −40° C. and a high temperature of 120° C. The Durometer Type A hardness of the cured product (the cured resin) is generally up to 75, preferably 5 to 75, more preferably 10 to [20] *70*, and most preferably 20 to 65. The Durometer Type A hardness of the cured product can be adjusted by selecting a crosslink density of the composition which is evaluated as a molar ratio (Y/X) of the content of SiH groups (Y) to the content of alkenyl groups (X) bonded to silicon atoms, an amount of organopolysiloxanes such as methylpolysiloxanes, vinylmethylpolysiloxanes and methylhydrogenpolysiloxanes having three-dimensional network structure (or resin structure) containing SiO₂, units, and an amount of reinforcing fillers.

AS A RESULT OF REEXAMINATION, IT HAS BEEN DETERMINED THAT:

Claims 1-3 are determined to be patentable as amended.

Claims 4 and 5, dependent on an amended claim, are determined to be patentable.

New claims 6-16 are added and determined to be patentable.

1. A light-emitting semiconductor potting composition comprising
   (A) 100 parts by weight of an organopolysiloxane [having] *comprising* a vinyl group at an end of its molecular chain, represented by the average compositional formula (1):

(1)

wherein R is a monovalent organic group, at least 5 mol % of R being phenyl, and "a" is a number of from [1.5 to 3.0] *from 1.8 to 2.2*, (B) an organohydrogenpolysiloxane having at least two hydrogen atoms each directly bonded to a silicon atom in a molecule, represented by the average compositional formula (2):

(2)

wherein R¹ is a monovalent organic group, b is a positive number of 0.7 to 2.1, c is a positive number of 0.001 to 1.0, and the sum of b+c is 0.8 to 3, in an amount to give 0.7 to 10 silicon atom-bonded hydrogen atoms per vinyl group in component (A), (C) a platinum group metal catalyst *selected from the group consisting of microparticulate platinum, microparticulate platinum adsorbed to carbon powder support, chloroplatinic acid, alcohol-modified chloroplatinic acid, olefin complexes of chloroplatinic acid, and platinum black* in an amount to give 1 to 1,000 ppm of platinum group metal based on the weight of components (A) and (B) combined, and (D) [0] *0.5* to 10 parts by weight of an organosilicon compound having [an] *a silicon atom-bonded* alkoxy group [bonded to a silicon atom], *silicon atom-bonded hydrogen atoms, and a 3-glycidoxy propyl group*,
   wherein the cured product of said composition [having] *has* a refractive index of 1.41 to 1.56 at 25° C. and 589 nm (sodium D line).

2. The composition of claim 1 [which is cured into] *wherein the cured product* [having] *of said composition has* a refractive index of 1.43 to 1.55 at 25° C. and 589 nm (sodium D line).

3. The composition of claim 1 [which is cured into] *wherein the cured product* [having] *of said composition has* a Durometer Type A hardness [up] *5* to 75.

*6. The composition of claim 1 wherein R contains phenyl group in an amount of 5 to 24.3 mol %.*

*7. The composition of claim 2, wherein the cured product of said composition has a Durometer Type A hardness of 10 to 70.*

*8. The composition of claim 2, wherein the cured product of said composition has a Durometer Type A hardness of 20 to 65.*

*9. The composition of claim 2, wherein the cured product of said composition has a refractive index of 1.48 to 1.55 at 25° C. and 589 nm (sodium D line).*

*10. The composition of claim 1 wherein component (D) is at least one compound selected from the group consisting of compounds having the following formulae (i) and (ii):*

*wherein m and n are integers of at least 1, and*

*11. The composition of claim 1, wherein the platinum group metal catalyst is selected from micro-particulate plati-* num, micro-particulate platinum adsorbed to carbon powder support, alcohol modified chloroplatinic acid, and platinum black.

12. The composition of claim 1, wherein the platinum group metal catalyst is an alcohol modified chloroplatinic acid.

13. The composition of claim 12, wherein the platinum group metal catalyst is 2-ethylhexyl alcohol-modified chloroplatinic acid.

14. The composition of claim 1, wherein the organohydrogenpolysiloxane of component (B) is selected from the group consisting of 1,1,3,3-tetramethyldisiloxane, 1,3,5,7-tetramethylcyclotetrasiloxane, both end trimethylsiloxy-capped dimethylsiloxane-methylhydrogensiloxane copolymers, both end dimethylhydrogensiloxy-capped dimethylpolysiloxane, both end dimethylhydrogensiloxy-capped dimethylsiloxane-methylhydrogensiloxane copolymers, both end trimethylsiloxy-capped methylhydrogensiloxane-diphenylsiloxane copolymers, both end trimethylsiloxy-capped methylhydrogensiloxane-diphenylsiloxane-dimethylsiloxane copolymers.

15. The light-emitting semiconductor device of claim 4, wherein the light emitting semiconductor member is die-bonded to an insulating house.

16. The light-emitting semiconductor device of claim 5, wherein the light emitting semiconductor member is die-bonded to the lead electrodes which are inserted through a housing.

* * * * *